United States Patent

Marohl

[11] Patent Number: 5,833,426
[45] Date of Patent: Nov. 10, 1998

[54] MAGNETICALLY COUPLED WAFER EXTRACTION PLATFORM

[75] Inventor: Dan A. Marohl, San Jose, Calif.

[73] Assignee: Applied Materials, Inc., Santa Clara, Calif.

[21] Appl. No.: 763,604

[22] Filed: Dec. 11, 1996

[51] Int. Cl.[6] .................................................. B65G 65/02
[52] U.S. Cl. ........................ 414/217; 414/331; 414/416; 414/786; 414/937; 414/939; 414/940
[58] Field of Search ................................... 414/217, 416, 414/937, 939, 786, 940, 331

[56] References Cited

U.S. PATENT DOCUMENTS

| | | | |
|---|---|---|---|
| 4,427,332 | 1/1984 | Manriquez | 414/937 X |
| 4,550,242 | 10/1985 | Uehara et al. | 414/937 X |
| 4,619,573 | 10/1986 | Rathmann et al. | 414/331 |
| 4,768,911 | 9/1988 | Balter | 414/939 X |
| 4,851,018 | 7/1989 | Lazzari et al. | 414/937 X |
| 4,968,206 | 11/1990 | Trillwood | 414/939 X |
| 5,007,784 | 4/1991 | Genov et al. | 414/937 X |
| 5,234,303 | 8/1993 | Koyano | 414/939 X |
| 5,409,348 | 4/1995 | Suzuki | 414/937 X |
| 5,435,682 | 7/1995 | Crabb et al. | 414/939 X |
| 5,507,614 | 4/1996 | Leonov et al. | 414/937 X |
| 5,540,821 | 7/1996 | Tepman | 414/939 X |
| 5,562,387 | 10/1996 | Ishii et al. | 414/939 X |
| 5,604,443 | 2/1997 | Kitamura et al. | 414/937 X |
| 5,613,821 | 3/1997 | Muka et al. | 414/937 X |
| 5,626,456 | 5/1997 | Nishi | 414/937 X |
| 5,647,718 | 7/1997 | Wiesler et al. | 414/937 X |

FOREIGN PATENT DOCUMENTS 63-211643  9/1988  Japan ....................................... 414/937

*Primary Examiner*—David A. Bucci
*Attorney, Agent, or Firm*—Michael A. Glenn

[57] ABSTRACT

A wafer extraction platform that is compatible with a high vacuum transfer system includes magnetically coupled upper and lower assemblies. A vacuum to atmosphere seal on the platform is maintained with two O-rings. Two opposing arrays of spaced, parallel blades in the upper assembly define slots for receiving wafers from a cassette. The upper assembly moves in response to a magnetically coupled linear slide mounted on the lower assembly. The upper assembly moves outside the load lock, and the blades pick up and simultaneously extract the wafers from the cassette. The upper assembly retracts into the load lock, and the wafers are transferred to the process chamber. A linear motor mounted at atmospheric pressure inside the lower assembly permits the horizontal movement of the upper assembly while holding the blades parallel to the wafers. Level adjustment screws and a bellows are used to level the platform.

28 Claims, 8 Drawing Sheets

MAGNETICALLY COUPLED WAFER EXTRACTION PLATFORM

BACKGROUND OF THE INVENTION

1. Technical Field

The invention relates to the handling of precision workpieces, such as semiconductor wafers. More particularly, the invention relates to a platform for extracting wafers from a wafer cassette.

2. Description of the Prior Art

Particle contamination is a major concern in semiconductor fabrication. The small feature sizes and increased number of deposited layers on the wafer surface make devices fabricated on the surface of such wafers very vulnerable to defects caused by particulate contamination. Such contamination may result in decreased processing yield, diminished device performance, or reduced reliability.

Semiconductor fabrication therefore requires a sophisticated clean room environment to prevent contamination of the wafers by foreign particles, such as dust. Such environment is extremely difficult to manufacture, and to maintain. As device size is reduced, the acceptable size of particulate matter in the cleanroommust also be decreased.

Similarly, semiconductor wafers may be transported and stored in a clean, relatively particle-free micro-environment. It is well known in the prior art to use a wafer cassette to store the wafers for transport in micro-environment containers such as a standard mechanical interface ("SMIF") box. In a typical SMIF-type box, fixed walls are joined to form a partial enclosure. A wafer cassette is placed within the partial enclosure, and a separable bottom is joined thereto. The wafer cassette is thus protected from potential contaminants.

Physical vapor deposition ("PVD") wafer processing is performed in ultra-high vacuum conditions in a process chamber. Other types of wafer processing, including chemical vapor deposition ("CVD") and plasma etch may be performed under high vacuum conditions. To process the wafers under such high or ultra-high conditions, it is necessary to transfer the wafers from the cassette to the vacuum process chamber, while minimizing contact with particulate contaminants. This has typically been accomplished through use of a load lock chamber.

Load lock chambers are designed to transfer the wafers under either atmospheric pressure or vacuum conditions. In an atmospheric pressure transfer, the process chamber is maintained at a lower pressure than the load lock chamber. Particulate contaminants, for example from the exterior of a SMIF-type box, will tend to enter the vacuum environment.

However, in a vacuum pressure load lock chamber, the pressure differential between the load lock and the process chamber is minimized. Contaminating particles are less likely to be drawn into the process chamber. A vacuum transfer system is therefore advantageous because it introduces fewer contaminating particles into the process environment than an atmospheric transfer system.

A single chamber load lock for use with a SMIF-type box is known in the prior art. In one such system, the SMIF-type box is placed onto a carrier plate on the vacuum chamber. The bottom portion of the box is separated therefrom, and the carrier plate and wafer cassette are lowered into the vacuum chamber. The SMIF-type box thus effectively functions as an upper chamber. However, such system requires that the wafers be loaded from the top of the chamber, i.e. in a relatively vertically direction.

It is also known to load wafers from the front or side of the chamber, i.e. in a relatively horizontal direction. For example, Brooks Automation of Chelmsford, Mass. has developed a multi-wafer end effector that reaches out to the cassette with a bisymmetric arm having dual end effectors. Each end effector is configurable independently to move in three axes of motion. The end effector blades at the end of the arm fit under the edges of the wafers. The wafers are simultaneously lifted, and are then pulled out of the cassette.

However, it is difficult, to use such multi-wafer end effector with a vacuum transfer system. The operating mechanism for the arms is complicated, and requires various feed-throughs, such as wire, cable, and rotational feed throughs, in the load lock chamber walls. Proper seals must be maintained around all of the openings in the chamber walls to permit the chamber to be pumped down to the vacuum levels necessary for wafer processing.

It is difficult, however, to insure the adequate functioning of the seals. Failure of such seals affects the time required to pump down the load lock chamber, and may prevent an adequate vacuum from being achieved. Contaminants may be introduced into the process chamber through the openings. Such contaminants reduce the quality of the processed wafers, increase the likelihood of mechanical failures, and must be frequently cleaned from the chamber walls. Processing expenses are thereby increased.

It would therefore be advantageous to provide a wafer extractor platform that eliminates the problems associated with seal failure in a high vacuum transfer system, such as wafer processing equipment.

SUMMARY OF THE INVENTION

The invention provides a wafer extraction platform that is compatible with vacuum transfer systems including ultra-high vacuum systems. The platform is formed of magnetically coupled upper and lower assemblies. A vacuum-to-atmosphere seal on the platform is maintained with two O-rings. The upper assembly includes two opposing arrays of spaced, parallel blades that define slots for receiving wafers from a cassette. The upper assembly is moved from inside to outside a load lock by a magnetically coupled linear slide. The slide comprises two linear bearings mounted on the lower assembly. The linear bearings permit the horizontal movement of the upper assembly while holding the blades parallel to the wafers. The upper assembly is magnetically coupled to a linear motor mounted at atmospheric pressure inside the lower assembly. An indexer permits vertical and rotational movement of the upper assembly. Level adjustment screws and a bellows are used to level the platform.

DETAILED DESCRIPTION OF THE INVENTION

The invention provides a magnetically coupled wafer extraction platform that is compatible with vacuum systems, such as wafer processing equipment. The invention is specially adapted for high vacuum transfers. The magnetically coupled mechanism of the invention eliminates both the feed-throughs and moving seals of the prior art. The disadvantages associated with such feedthroughs and moving seals are therefore reduced or eliminated by the invention.

A wafer cassette containing semiconductor wafers may be transported in a clean, relatively particle-free microenvironment container, such as a standard mechanical interface ("SMIF") box. The wafer cassette is thus protected from potential contaminants. The wafers are subsequently transferred from the cassette to the vacuum process chamber through use of a load lock chamber.

While some load locks are large enough to enclose a SMIF-type box, or a wafer cassette, other load lock chambers are not large enough to contain a cassette. It is necessary, in such cases, to provide a mechanism known as an end-effector, to remove the wafers from the cassette for transfer to the load lock. For example, it is not feasible to enclose an entire 300 mm wafer cassette in a 300 mm load lock. The wafers must be removed from the cassette externally, and brought into the load lock by an end effector for transfer to the process chamber.

The wafers may be removed one, several, or all at one time. A conventional multi-wafer end effector has an arm that moves rotationally, as well as in X, Y, and Z directions to reach the wafers. A plurality of forked blades at the end of the arm fits under the edges of the wafers. The wafers are simultaneously lifted, and are then pulled out of the cassette.

Figure 1:
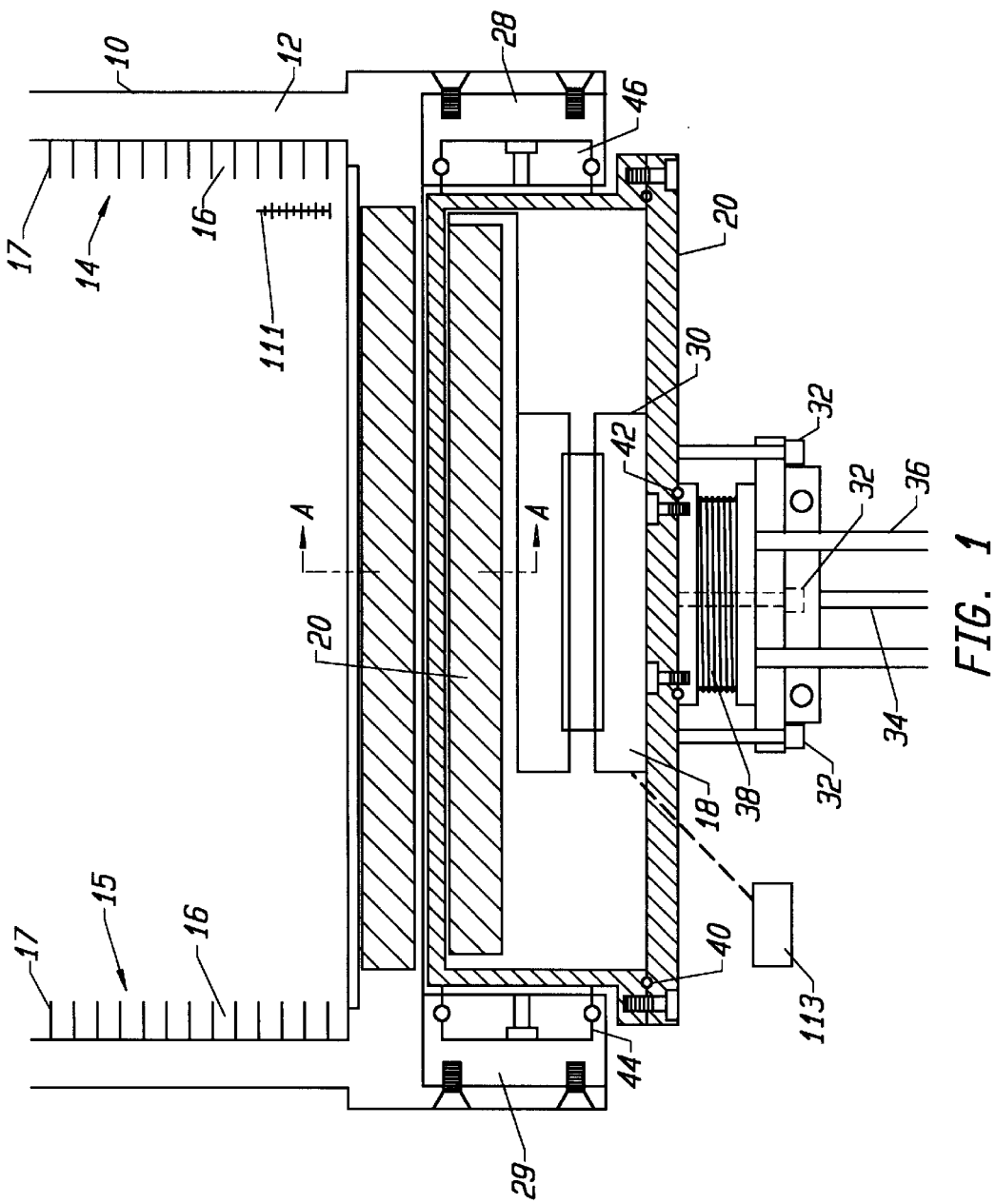
FIG. 1 is a front cross-sectional view of the magnetically coupled wafer extraction platform according to the invention.

FIG. 1 is a front cross-sectional view of the magnetically coupled wafer extraction platform 10 according to the invention. The wafer extractor platform housing is formed of a conventional non-magnetic material, such as aluminum. The platform includes both upper 12 and lower 20 assemblies.

The upper assembly 12 includes two opposing arrays 14, 15 of spaced, parallel blades 17. The opposing blades define wafer slots 16 for receiving wafers from a cassette. The upper assembly also includes an upper magnet set 22 (see FIG. 2), coupled to a lower magnet set 24 (see FIG. 2) of the lower assembly. The upper and lower magnet sets are described in more detail in FIG. 2. As the lower magnet set 24 is moved, the coupled upper magnet set also moves in response thereto, thereby moving the entire upper assembly.

The lower magnet set 24 is enclosed by a vacuum seal of the lower assembly. The preferred embodiment of the invention requires only two O-rings to maintain a vacuum-to-atmosphere seal on the platform. O-ring leakage and permeation are significant detrimental factors to the maintenance of a vacuum system. The reduction in number of O-rings over the prior art afforded by the invention therefore decreases leakage of gas and contaminating particles into the vacuum process chamber.

A first O-ring 40 seals the lower assembly 20 and a second O-ring 42 seals a bellows assembly 38 to the lower assembly. Bellows are used to permit movement, while isolating the vacuum. The bellows assembly permits the wafer extractor level to be movably adjusted by use of level adjustment screws 32.

A leveling mechanism is provided to level the platform. In the preferred embodiment of the invention, the leveling mechanism includes three leveling screws 32 that may be individually or collectively adjusted to level the platform. However, any number of screws may be used to level the platform. For example, the level adjustment screws may be configured such that tightening a screw raises the corresponding portion of the lower assembly. Alternatively, the screws may be configured such that tightening a screw draws the lower assembly down, thereby lowering the level of the lower assembly.

The leveling screws may be either manually or automatically adjusted. For example, the screws may be manually adjusted with a screwdriver or ratchet. A motorized assembly 107, shown in FIG. 4b, may be provided to automatically adjust the screws. The level adjustment may be performed in response to measurements by balance or alignment detectors readily known in the art, that are joined to the invention.

Figure 4A:
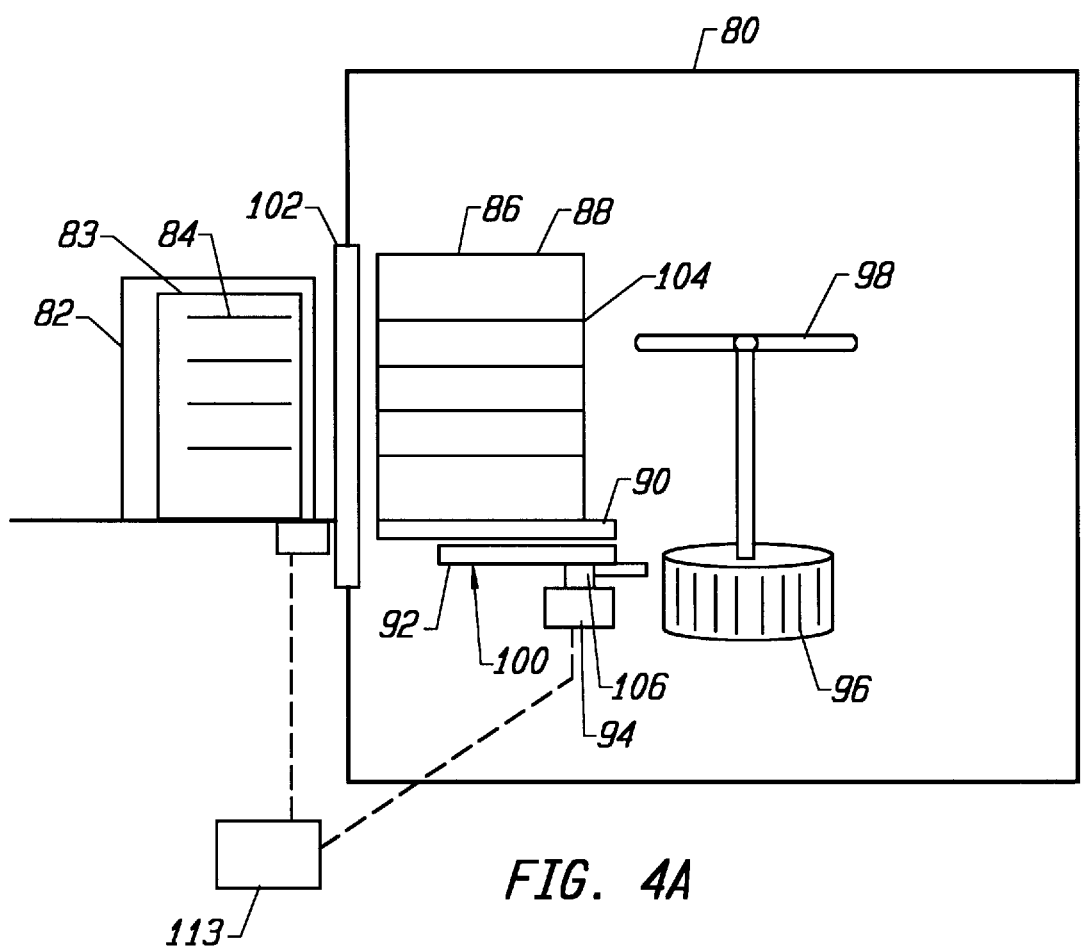
FIGS. 4a–4c are side sectional views sequentially showing the operation of the magnetically coupled wafer extraction platform according to the invention.
Figure 4B:
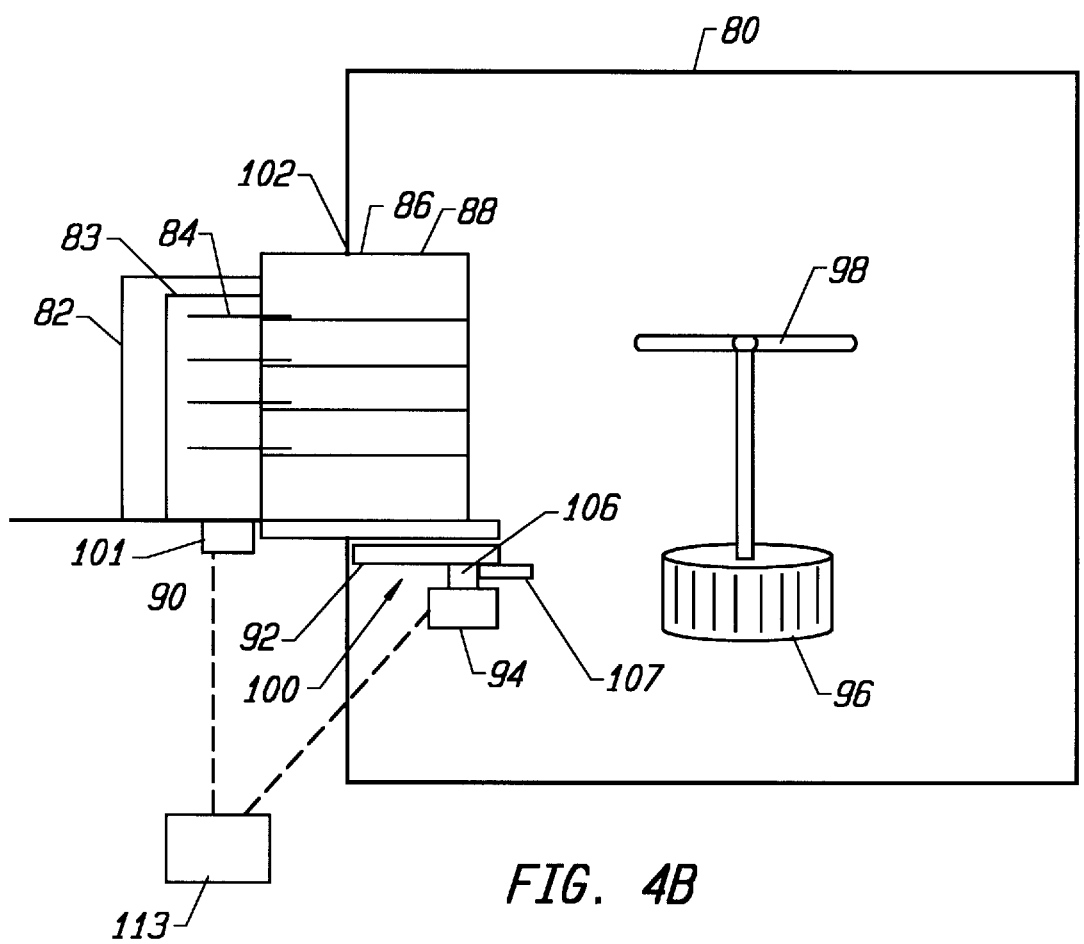

In one embodiment of the invention, a positioning mechanism 101, shown in FIG. 4b, is provided for setting a position of the wafers in the cassette. The positioning mechanism preferably comprises an indexer 30 (FIG. 1) and the above described leveling screws 32, both of which operate in combination to move the platform vertically and forward, such that the blades of the upper assembly are inserted under the wafer. One embodiment of the invention provides a calibration mark 111 (FIG. 1) to which the blades may be manually set by adjusting the pitch and role of the upper assembly with the leveling screws, or may be automatically set using feedback and/or control information stored in a general purpose controller.

In another embodiment of the invention, the positioning mechanism includes a sensor and a controller that compares the level of the wafers and the spacing therebetween, as sensed by the sensor, and develops a signal that operates a servo to position the wafer handler blades. The blades are aligned in response to this comparison, so that a blade is located at a lower level than that of the corresponding wafer. The blade may therefore be inserted below the wafer, and then raised to lift the wafer for removal from the cassette. Alternate embodiments of the invention use any other suitable adjustment means. For example, the sensor and controller may be arranged in a feedback configuration that is incorporated into the positioning mechanism to control such positioning. The upper assembly may thereby be precisely positioned relative to the wafer handler blades for transferring the wafers to and from the process chamber.

Wire and other feed-throughs 34 routed to the indexer 30 are enclosed within the hollow indexer shaft 36. The indexer shaft is joined to the lower assembly via the bellows 38. The wire and other feed-throughs therefore do not project into the vacuum enclosure of the lower assembly. Thus, the O-ring seals used in prior art rotational feed throughs are eliminated, thereby ameliorating the problems of leakage, contamination, and mechanical failure associated therewith.

The wire and other feed-throughs supply the power required to drive the motors that move the platform. In a preferred embodiment of the invention, the platform includes a linear motor 18, such as a linear stepper motor or servo mechanism. The linear motor is used to move the lower magnet set in a linear, or horizontal, direction. The magnetically coupled upper assembly moves in response thereto.

The upper assembly 12 slides out linearly from the extraction platform to the wafer cassette. The indexer 30 moves the upper assembly vertically to pick up all of the wafers. The indexer provides the vertical movement necessary to adjust the positions of the blades to those of the wafers. The blades are inserted into the wafer cassette and below the wafers. The indexer then moves the upper assembly upward. The wafers are thereby lifted by the blades. The upper assembly is then retracted in the linear direction to bring the wafers into the load lock.

The upper assembly is supported by two parallel linear bearing assemblies 28, 29 that form a linear slide. The linear bearing assemblies are maintained in a vacuum. One side of each bearing is attached to the lower assembly, and the other side is attached to the upper assembly. In the preferred embodiment of the invention, the linear bearings 46 are THK type linear crossed roller bearings. THK bearings are substantially square in shape, with a notch to prevent rotation and to hold the bearings within the tracks 44. The linear bearings support the weight of the upper assembly and permit linear motion to and from the wafer cassette. The linear bearings permit the horizontal movement of the upper assembly while holding the blades substantially parallel to the wafers.

Figure 2:
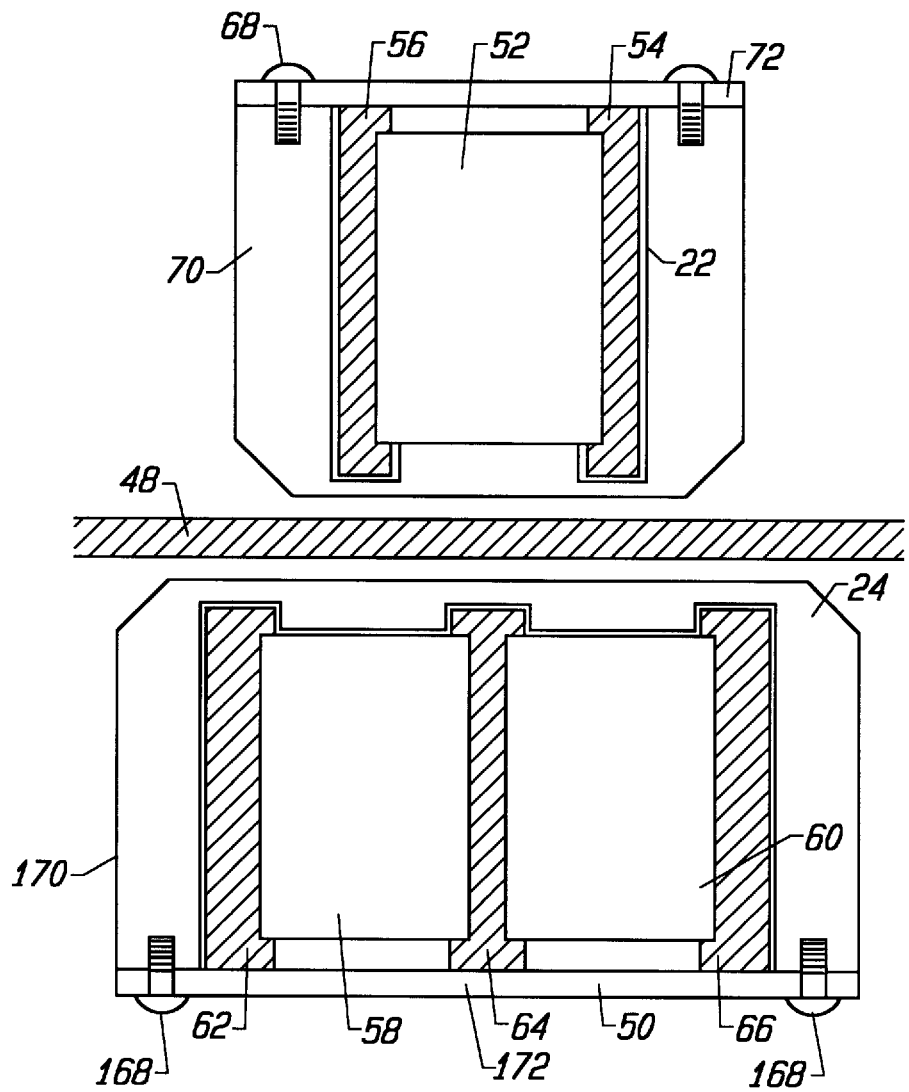
FIG. 2 is a side sectional view of the magnetically coupled wafer extraction platform along section A—A according to the invention.

FIG. 2 is a side sectional view along section A—A of FIG. 1 according to the invention. The linear motor 18 and indexer 30 (see FIG. 1) are connected to the mounting 50 of the lower assembly. Both upper and lower assemblies are provided with sets of magnets, 22 and 24, respectively. As the lower magnet set 24 is moved linearly towards and away from the wafer cassette, the magnetically coupled upper magnet set 22 moves in response thereto. The wall 48 of the lower assembly remains stationary.

In the preferred embodiment of the invention, the upper magnet set includes one magnet 52 and two pole pieces 54, 56. The lower magnet set includes two magnets 58, 60 and three corresponding pole pieces 62, 64, 66. The pole pieces are formed of a ferromagnetic material with which the field lines of the upper and lower magnet sets may be conducted. These magnetic flux lines intersect the pole pieces to produce the magnetic coupling between the upper and lower magnets.

The upper magnet is better coupled and more solidly held if three pole pieces are provided in the bottom magnet and two pole pieces are provided in the top magnet. It is presently believed that such configuration provides the best intersection with the field lines, thereby minimizing undesirable shifting as the upper and lower assemblies in the linear direction. When the lower magnet set 24 is moved by the linear motor 30, the magnetic flux lines move therewith. The magnetically coupled upper magnet set 22 moves in response to the positioning of the magnetic flux lines. The upper assembly thereby slides linearly to and from the extraction platform to extract and return the wafers from the cassette.

The magnet sets are assembled in a housing 70/170, and covered with a magnet cover 72/172. In one embodiment of the invention, the housing is formed of aluminum. The magnet cover is secured to the housing by means including screws 68/168 or bolts.

A controller 113 may be provided to direct the movement of the lower assembly. The position of the linear motor can be detected by the use of an encoder or resolver. The controller may also be in communication with the mechanism 101 for setting a position of the wafers in the cassette (see FIG. 4a). The movement of the lower assembly, and the magnetically coupled upper assembly, may thus be precisely calibrated. Wafer extraction is thereby aided by having a controlled position at all times.

Figure 3:
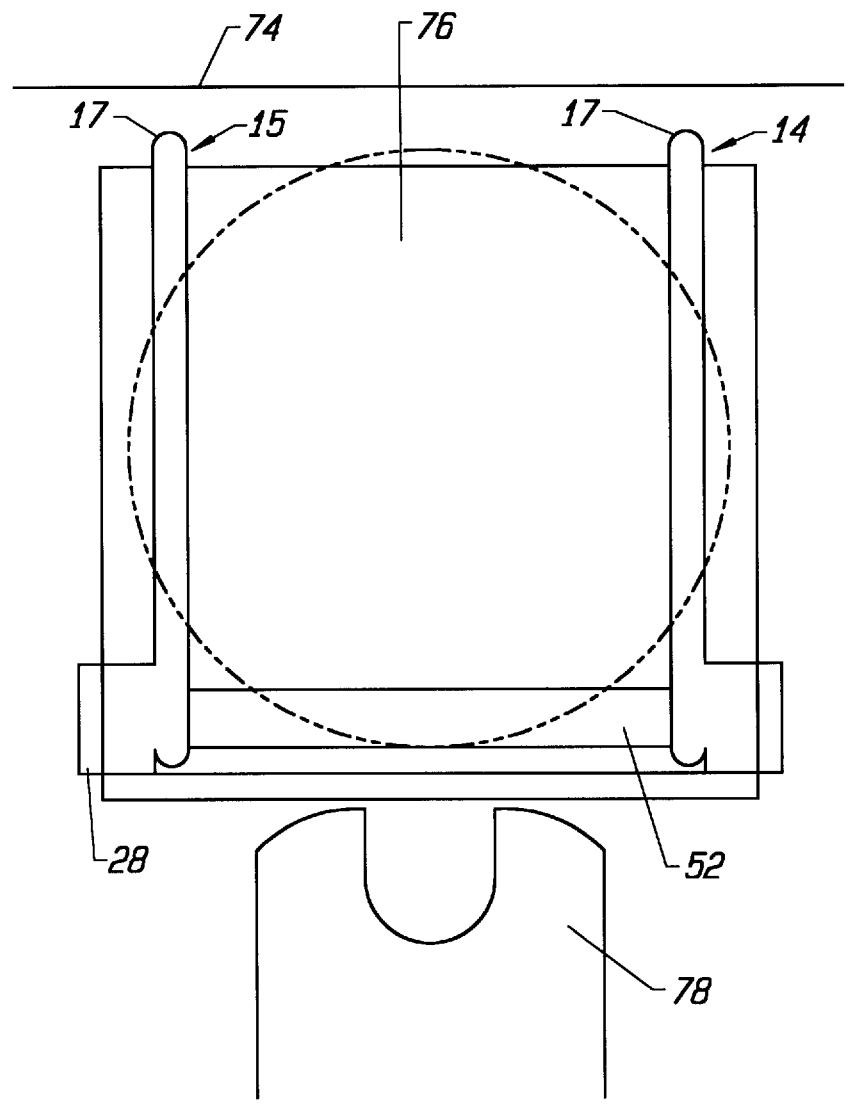
FIG. 3 is a top sectional view of the magnetically coupled wafer extraction platform according to the invention.

FIG. 3 is a top sectional view of the magnetically coupled wafer extraction platform, according to the invention. The upper assembly slides forward along the linear bearing assemblies 28, and the blades 17 protrude out the front 74 of the load lock. The arrays of blades 14, 15 pick up all of the wafers 76 simultaneously from the cassette, and the upper assembly 12 then retracts into the load lock. The wafer handler assembly 78, using z-axis motion, then enters between the blades and lifts out one wafer at a time for transfer to the semiconductor fabrication system.

Figure 4C:
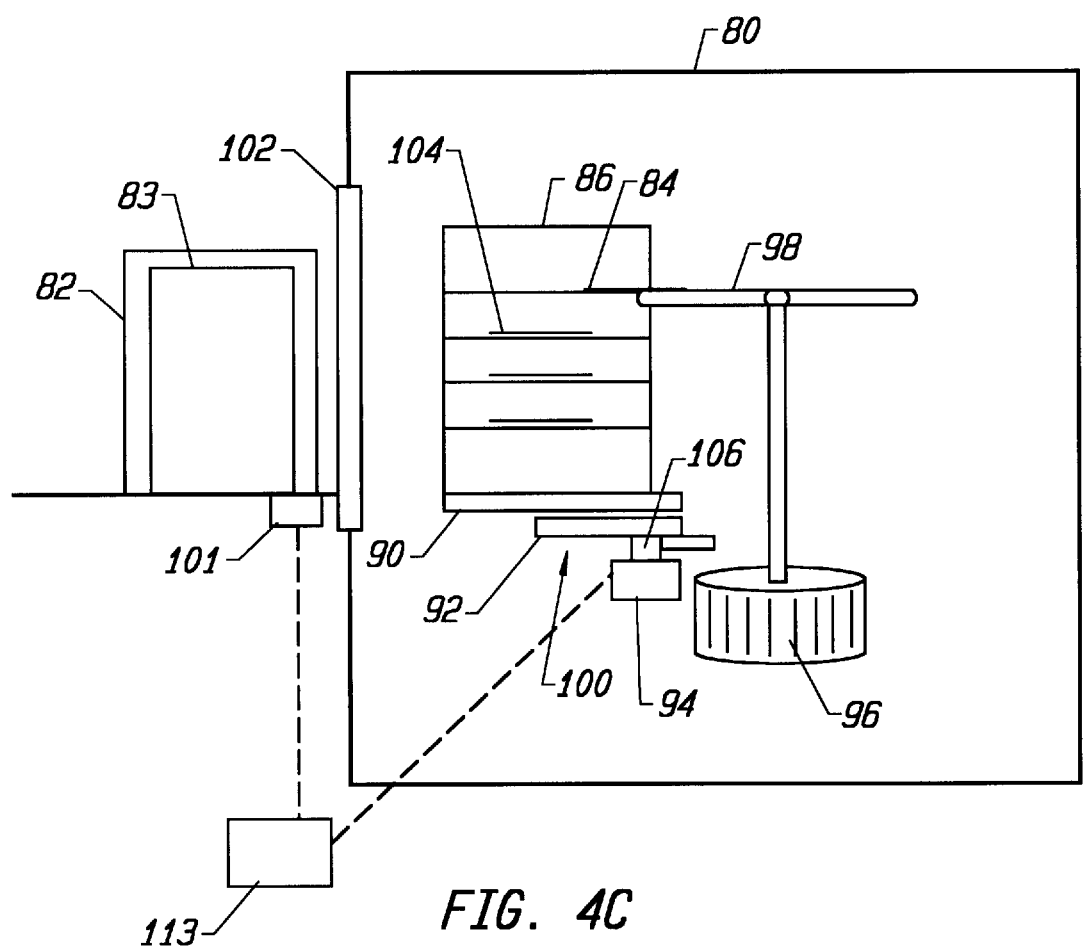
Figures 5A, 5B:
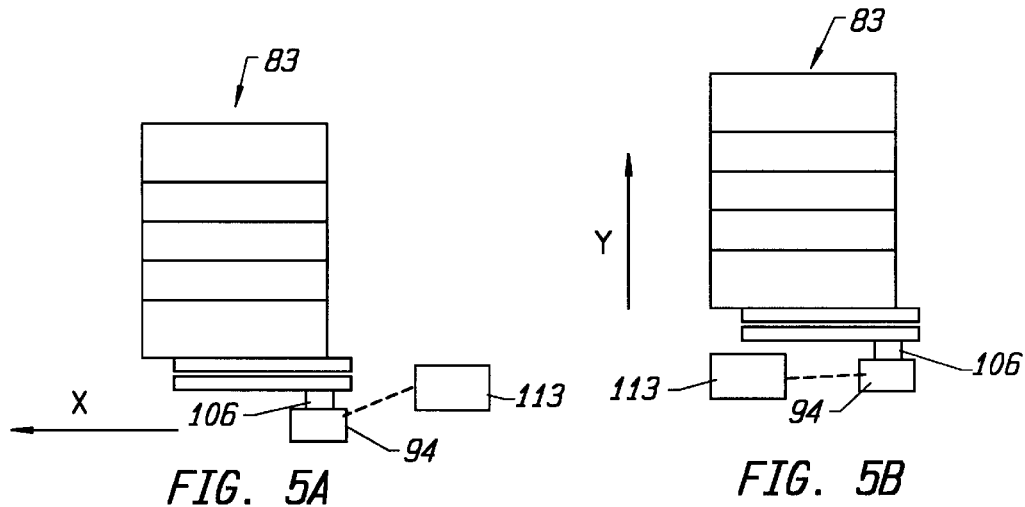
FIG. 5a is a diagram illustrating the linear horizontal movement of the platform according to the invention.
FIG. 5b is a diagram illustrating the vertical movement of the platform according to the invention.
Figures 5C, 5D:
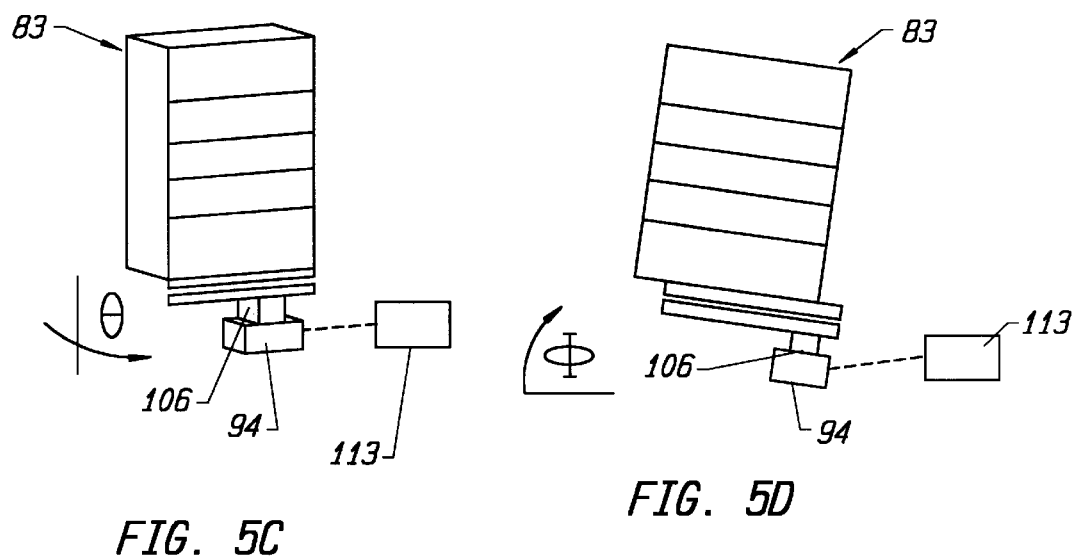
FIG. 5c is a diagram illustrating the rotational movement of the platform in the θ direction according to the invention.
FIG. 5d is a diagram illustrating the rotational movement of the platform in the Φ direction according to the invention.

FIGS. 4a–4c are side sectional views sequentially showing the operation of the magnetically coupled wafer extraction platform 100 according to the invention. In FIGS. 4a–4c there are shown four parallel blades 88 for extracting up to four wafers 84. It is understood that the invention may include an array containing more or less than four wafers.

FIG. 4a shows the magnetically coupled wafer extraction platform prior to extraction of the wafers from the cassette. The cassette holder 82, which is a box that holds the wafer cassette 83 carrying the wafers 84, is positioned flush to the opening 102 to the load lock 80. The opposing arrays of spaced, parallel blades 88 in the upper assembly 86 define wafer slots 104 for receiving the wafers from the cassette.

FIG. 4b shows the magnetically coupled wafer extraction platform during extraction of the wafers from the cassette. The linear motor 94 causes the lower magnet 92 set to slide out linearly from the extraction platform to the wafer cassette. The upper magnet set 90 also slides out linearly, in response thereto. An indexer 106 moves the upper assembly 86 vertically to orient the blades to the wafers. The wafers are thereby picked up and held within the individual wafer slots 104.

The figures illustrate the use of a multi-wafer end effector. However, one skilled in the art will readily appreciate that the invention may also be used with a single wafer end effector.

FIG. 4c shows the magnetically coupled wafer extraction platform subsequent to extraction of the wafers from the cassette. The upper assembly is retracted in the linear direction to bring the wafers into the load lock. The wafer handler assembly 96 then enters between the blades and the wafer transport 98 lifts one wafer for transfer into the semiconductor fabrication machine. In one embodiment of the invention, the wafer handler may be of the "frog-leg" magnetically coupled type or any other type of wafer handler having at least "X" and "Y" motion, as is known in the art. In an alternate embodiment of the invention, the wafer handler assembly removes more than one wafer at a time from the cassette.

FIGS. 5a–5d are diagrams illustrating the movement of the platform according to the invention. The indexer and linear motor combination permits movement in three directions. The linear motor 94 permits linear movement in the "X" direction. The indexer 106 permits vertical movement in the "Z" direction. Additionally, the indexer 106 has a rotation feature. The platform may thereby be rotated in the "θ" direction. In one embodiment of the invention, the indexer additionally may tilt the platform in the "Φ" direction. The platform may thus be linearly and rotationally moved responsively to the position of the wafer cassette 83.

Figure 6:
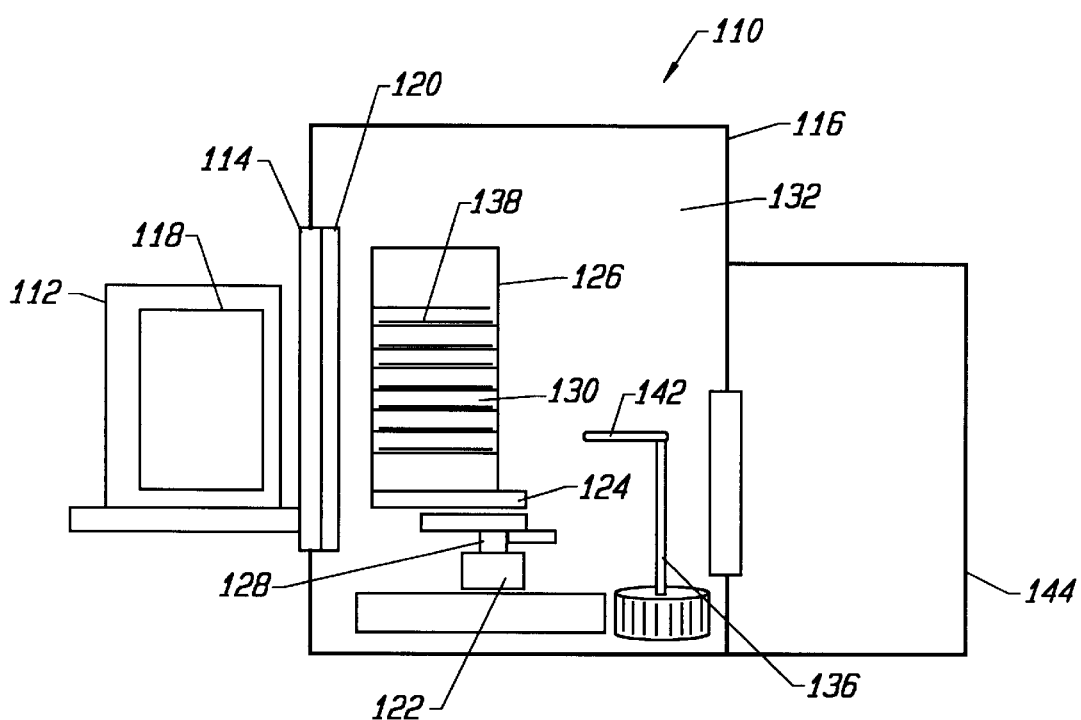
FIG. 6 is a side sectional view of an exemplary semiconductor fabrication system according to the invention.

The invention may be used with processing systems having one or more processing modules, such as a cluster arrangement. FIG. 6 is a side sectional view of an exemplary semiconductor fabrication system 110 according to the invention. A wafer cassette holder 112, such as a SMIF-type box, is positioned flush to the opening 114 of the load lock 116. The wafer cassette holder and wafer cassette 118 are opened by the load/unload mechanism 120.

A linear motor 122 causes the lower assembly 124 of the invention to slide out linearly from the extraction platform to the wafer cassette. The magnetically coupled upper assembly 126 also slides out linearly, in response thereto. An indexer 128 moves the upper assembly vertically to orient the wafer slots 130 to the wafers. The wafers are thereby picked up and held within the individual wafer slots. The upper assembly is retracted in the linear direction to bring the wafers into the chamber 132 of the load lock 116.

The load lock chamber is then sealed and evacuated. While FIG. 6 shows a one chamber load lock, one skilled in the art will readily appreciate that the invention may also be used with two chamber load lock systems (see, for example U.S. Pat. No. 5,391,035, Microenvironment Load Lock).

Once transferred to the lower chamber, a wafer handler assembly 136 inserts an end effector 142 into the upper assembly to extract a wafer 138 therefrom. FIG. 6 shows a single wafer end effector 142. However, as previously described, the invention may also be used with a multi-wafer end effector. The end effector transfers the wafer 138 to the semiconductor fabrication system 144 for processing. The wafers are each returned to the cassette when processing has been completed.

Although the invention is described herein with reference to the preferred embodiment, one skilled in the art will readily appreciate that other applications may be substituted for those set forth herein without departing from the spirit and scope of the present invention. For example, the magnetic coupling may be provided at a vertical orientation. The invention may thereby be used with systems for vertically oriented wafer loading.

One skilled in the art would readily recognize that the invention may remove any designated number, or all of the wafers from the cassette. The invention may be used with wafer handler systems that remove one or more wafers at a time for transfer to the process chamber.

I claim:

1. A wafer extraction platform, comprising:

a lower assembly;

an upper assembly comprising a water carrier having at least one wafer slot defined therein;

an indexer to vertically move said upper assembly;

a magnetic coupling between said upper assembly and said lower assembly; and a linear motor for moving a magnet in said lower assembly to effect a corresponding movement of said upper assembly.

2. The wafer extraction platform of claim 1, wherein said upper assembly is retractably moved from a load lock to extract at least one wafer from a cassette.

3. The wafer extraction platform of claim 1, further comprising: a linear slide to permit movement of said upper assembly in response to movement of said magnet in said lower assembly.

4. The wafer extraction platform of claim 1, wherein said wafer carrier comprises two spaced parallel arrays each having defined therein at least one slot for receiving a wafer.

5. The wafer extraction platform of claim 1, wherein said upper assembly simultaneously extracts a plurality of wafers from said cassette.

6. The wafer extraction platform of claim 1, wherein said lower assembly comprises a hollow shaft to receive feed throughs to said platform.

7. The wafer extraction platform of claim 1, wherein said coupling is a magnetic coupling that comprises:

an upper magnet set joined to said upper assembly; and a lower magnet set joined to said lower assembly.

8. The wafer extraction platform of claim 7, wherein each of said upper and lower magnet sets is assembled in a housing and secured with a magnet cover.

9. The wafer extraction platform of claim 7, wherein said upper magnet set includes one magnet and two corresponding pole pieces; and said lower magnet set includes two magnets and three corresponding pole pieces.

10. The wafer extraction platform of claim 1, wherein said motor further comprises a controller to direct the movement of said lower assembly.

11. The wafer extraction platform of claim 1, wherein said linear motor comprises either a linear stepper motor or linear servo mechanism motor.

12. The wafer extraction platform of claim 1, wherein said linear motor is mounted at atmospheric pressure inside said lower assembly.

13. The wafer extraction platform of claim 1, wherein said linear slide comprises at least two linear bearings, one side of each of which is attached to said lower assembly.

14. The wafer extraction platform of claim 13, wherein said linear bearings permit the horizontal movement of said upper assembly while holding said wafer carrier substantially parallel to said wafers in said cassette.

15. The wafer extraction platform of claim 13, wherein said linear bearings are maintained at a vacuum in a vacuum enclosure within said lower assembly.

16. The wafer extraction platform of claim 13, wherein said linear bearings are THK type bearings.

17. The wafer extraction platform of claim 1, further comprising a vacuum-to-atmosphere seal enclosing said lower magnet set of said platform to define a vacuum enclosure within said lower assembly.

18. The wafer extraction platform of claim 17, wherein said vacuum to atmosphere seal further comprises:

a first O-ring to seal said lower assembly; and a second O-ring to seal a bellows to said lower assembly.

19. The wafer extraction platform of claim 1, further comprising a positioning mechanism for leveling said platform.

20. The wafer extraction platform of claim 19, said positioning mechanism further comprising:

an indexer;

at least one level adjustment screw; and a calibration mark to which said slots may be set by adjusting the height of said upper assembly with said indexer and/or said level adjustment screw;

wherein said indexer and said at least one level adjustment screw operate in combination to move said platform vertically and forward.

21. The wafer extraction platform of claim 19, said positioning mechanism further comprising;

a controller;

wherein said controller is incorporated into said positioning mechanism to control positioning of said platform; and wherein said controller compares the level of said slots, and develops a signal that operates to position said slots.

22. The wafer extraction platform of claim 19, wherein said leveling mechanism further comprises:
   at least one level adjustment screw that is positioned relative to said platform so that said platform may be moved by said screw to level said platform;
   a hollow shaft to receive feed throughs to said platform; and
   a bellows joining said hollow shaft to said lower assembly.

23. The wafer extraction platform of claim 22, wherein said level adjustment screw is positioned relative to said platform so that said platform may be moved by said screw to level said platform, and wherein said screw is adjusted by either manual means or by a motorized assembly coupled thereto.

24. A wafer extraction platform, comprising:
   a lower assembly comprising a hollow shaft to receive feed throughs to said platform, at least one level adjustment screw, and a bellows joining said hollow shaft to said lower assembly to permit adjustments to the level of said platform;
   an upper assembly having at least one wafer slot defined therein by two opposing arrays of spaced, parallel blades;
   a lower magnet set joined to said lower assembly;
   an upper magnet set joined to said upper assembly, wherein said upper assembly is magnetically coupled said to said lower assembly;
   a linear motor joined to said lower assembly to horizontally move said lower magnet set;
   an indexer to vertically move said upper assembly;
   at least two linear bearings maintained at a vacuum, one side of each of which is attached to said lower assembly to permit the horizontal movement of said upper assembly in response to movement of said lower magnet set, while holding said blades substantially parallel to said wafers in said cassette;
   a first O-ring to seal said lower assembly, and a second O-ring to seal said bellows to said lower assembly
   wherein said upper assembly is retractably moved from a load lock to simultaneously extract a plurality of wafers from a cassette for transfer to a semiconductor fabrication system.

25. A process for extracting wafers from a cassette, comprising the steps of:
   magnetically coupling an upper assembly having at least one wafer slot defined therein to a lower assembly;
   moving a magnet in said lower assembly with a linear motor;
   providing an indexer to vertically move said upper assembly;
   providing a linear slide to permit movement of said upper assembly in response to movement of said magnet in said lower assembly; and
   sealing a wafer extraction platform to provide a vacuum therein;
   wherein said upper assembly is retractably moved from a load lock to simultaneously extract a plurality of wafers from a cassette for transfer to a semiconductor fabrication system.

26. A semiconductor fabrication system, comprising:
   a load lock chamber;
   at least one vacuum process chamber joined to said load lock chamber; and
   a wafer extraction platform, comprising:
      a lower assembly including a hollow shaft to receive feed throughs to said platform, said lower assembly having a lower magnet set joined thereto;
      an upper assembly having at least one wafer slot defined therein by two opposing arrays of spaced, parallel blades, said upper assembly further including an upper magnet set joined thereto such that said upper assembly is magnetically coupled to said lower assembly;
      a linear motor joined to said lower magnet set to horizontally move said lower magnet set; and
      an indexer to vertically move said upper assembly;
   wherein said upper assembly is retractably moved from said load lock to simultaneously extract a plurality of wafers from a cassette for transfer to a vacuum process environment.

27. The semiconductor fabrication system of claim 26, further comprising:
   at least two linear bearings maintained at a vacuum, one side of each of which is attached to said lower assembly to permit the horizontal movement of said upper assembly in response to movement of said lower magnet set, while holding said blades substantially parallel to said wafers in said cassette;
   a controller to direct the movement of said lower assembly,
   a mechanism for leveling said platform comprising at least one level adjustment screw, and a bellows joining said hollow shaft to said lower assembly to permit adjustments to the level of said platform; and
   a first O-ring to seal said lower assembly, and a second O-ring to seal said bellows to said lower assembly.

28. The semiconductor fabrication system of claim 26, further comprising a wafer handler for removing a wafer from said wafer extraction platform for transfer to vacuum process chamber.

* * * * *